United States Patent [19]

Nagano

[11] 4,418,290

[45] Nov. 29, 1983

[54] VOLTAGE COMPARATOR

[75] Inventor: Katsumi Nagano, Hiratsuka, Japan

[73] Assignee: Tokyo Shibaura Denki Kabushiki Kaisha, Japan

[21] Appl. No.: 265,236

[22] Filed: May 19, 1981

[30] Foreign Application Priority Data

May 26, 1980 [JP] Japan .................................. 55-69939

[51] Int. Cl.³ .............................................. H03K 5/24
[52] U.S. Cl. .................................. 307/355; 307/362; 330/252; 330/257
[58] Field of Search ....................... 307/355, 356, 362; 328/147; 330/252, 257

[56] References Cited

U.S. PATENT DOCUMENTS 3,649,846 3/1972 Frederikson .......................... 307/235
3,979,686 9/1976 Schade, Jr. ......................... 330/30 D
4,147,944 4/1979 Monticelli ............................ 307/355

FOREIGN PATENT DOCUMENTS 55-47712 4/1980 Japan .

Primary Examiner—John Zazworsky
Attorney, Agent, or Firm—Finnegan, Henderson, Farabow, Garrett & Dunner

[57] ABSTRACT

Input transistors respectively provided for noninverting and inverting inputs are of the PNP conductivity type. The input transistors are respectively connected to a pair of transistors which form a differential pair. The differential transistors are NPN conductivity type transistors which are opposite in their conductivity type to the conductivity type of the input transistors. The differential pair is connected to a current-mirror circuit and an output circuit section. Thus, an output signal corresponding to the voltage level difference between the input signals supplied to the pair input terminals is provided from an output terminal.

17 Claims, 12 Drawing Figures

VOLTAGE COMPARATOR

BACKGROUND OF THE INVENTION

This invention relates to a voltage comparator, which compares a plurality of input signals and provides an output signal corresponding to the voltage level difference of these input signals.

A prior art voltage comparator shown in FIG. 1, has a construction comprising an input circuit section 10 to receive a pair of input signals, a current-mirror circuit section 12 functioning as an active load with respect to the input circuit section 10, and an output circuit section 14. The input circuit section 10 includes a pair of PNP conductivity type signal input transistors, more particularly a noninverting input transistor 16 and an inverting input transistor 18. The collectors of these transistors 16 and 18 are connected to a ground potential line 20 which is further connected to ground G, and input signals applied to terminals 22, 24 are supplied to the bases of the transistors 16 and 18 respectively. The emitters of these signal input transistors 16 and 18 are connected through constant-current sources 26 and 28 to a high potential line, i.e., a power potential line 30.

The emitters of the transistors 16 and 18 mentioned above are also connected to the bases respectively of two transistors 34 and 36 which constitute a differential pair 32. The differential pair transistors 34 and 36 have the same conductivity type as the signal input transistors 16 and 18, i.e., PNP conductivity type. The emitters of the differential pair transistors 34 and 36 are commonly connected to each other and further connected through a constant-current source 38 to the power potential line 30. The collectors of the differential pair transistors 34 and 36 are connected to the ground potential line 20 through the aforementioned current-mirror circuit 12. The collector of the differential pair transistor 34 is also connected to the base of an output transistor 40 in the output circuit section 14. The output transistor 40 has its emitter grounded and its collector connected through a load resistor 42 to a power potential line 30. The collector of the output transistor is also directly connected to the output terminal 44.

In such a voltage comparator as described, when the voltage level $V_{in(+)}$ of the input signal supplied to the noninverting transistor 16 becomes higher than the voltage level $V_{in(-)}$ of the input signal supplied to the inverting input transistor 18 (these input signals being assumed to be either a positive voltage or 0 V), the noninverting input transistor 16 is in the "off" state. This has an effect of turning "off" the differential pair transistor 34 connected to the noninverting input transistor 16. At this time, no current flows to the base of the output transistor 40, so that the output transistor 40 is also in the "off" state, thus causing a high level voltage substantially the same as the power voltage $V_{cc}$ to appear at the output terminal 44 causing the output terminal 44 is become in the logic "HIGH" level. On the other hand, when the input voltage $V_{in(+)}$ to the noninverting input transistor 16 becomes lower than the input voltage $V_{in(-)}$ to the inverting input transistor 18, the noninverting input transistor 16 is turned "on", thus turning "on" the corresponding differential pair transistor 34 and output transistor 40. Thus, a low level voltage, i.e., substantially the ground potential, appears at the output terminal 44. In this way, an output signal, which changes in level between the ground potential level or logic "LOW" level and the power voltage level or logic "HIGH" level in accordance with the polarity of the and voltage level difference between a pair of input signals, is obtained.

Here, denoting the voltages of the noninverting and inverting input signals respectively by $V_{in(+)}$ and $V_{in(-)}$ as described above, they are related to the power voltage $V_{cc}$ as $$V_{in(+)} + V_{BE(16)} + V_{BE(34)} + V_S = V_{cc} \quad (1)$$

and $$V_{in(-)} + V_{BE(18)} + V_{BE(36)} + V_S = V_{cc} \quad (2)$$

where $V_{BE(16)}$: the base-emitter voltage across the noninverting input transistor 16;

$V_{BE(34)}$: the base-emitter voltage across the differential pair transistor 34 connected to the noninverting input transistor 16;

$V_{BE(18)}$: the base-emitter voltage across the inverting input transistor 18;

$V_{BE(36)}$: the base-emitter voltage across the differential pair transistor 36 connected to the inverting input transistor 18; and $V_S$: the voltage drop across the constant-current source 38 connected between the junction of the emitter of the differential pair transistors 34 and 36 and the power potential line 30.

Since the input signal voltages $V_{in(+)}$ and $V_{in(-)}$ are such that:

$$V_{in(+)} \geq 0 \quad (3)$$

and $$V_{in(-)} \geq 0, \quad (4)$$

by setting
$$V_{BE(16)} = V_{BE(18)} = V_{BE(34)} = V_{BE(36)} = V_{BE},$$

from the equations 1 and 2, there is obtained $$V_{cc} = 2V_{BE} + V_S \quad (5)$$

Actually, the base-emitter voltage $V_{BE}$ across the individual transistors is 0.7 V and the voltage drop $V_S$ across the constant-current source 38 is 0.1 V, by substituting these values into the equation 5

$$V_{cc} \geq 1.5 \quad (6)$$

Thus, it will be seen that for the operation of the prior art voltage comparator a voltage of at least more than 1.5 V is necessary as the power voltage.

Since according to Equation 6 a power voltage $V_{cc}$ as large as 1.5 V generates an ineffective voltage drop, according to Equations 1 and 2 a power voltage $V_{cc}$ set for instance at 2 V restricts allowable voltage amplitudes of the input signals restricted to a narrow range between 0 and 0.5 V.

SUMMARY OF THE INVENTION

An object of the invention is to provide a voltage comparator, which can operate efficiently with a low power voltage and can also provide a wide allowable amplitude range for an input signal.

The voltage comparator according to the present invention comprises an input circuit means provided between first and second potential lines for receiving first and second electrical signals and providing an output current varying according to the voltage level difference between the first and second electrical signals. The input circuit means includes first and second transistors of one conductivity type, the aforementioned first and second electrical signals being respectively supplied to base electrodes of the first and second transistors, and a differential pair formed by third and fourth transistors connected to the respective first and second transistors and of the opposite conductivity type thereto. Further, a current-mirror circuit is connected to the input circuit means, and an output circuit means, which has a switching operation in response to the output current transmitted from the input circuit means to provide a third electrical signal corresponding to the voltage level difference between the aforementioned first and second electrical signals, is connected to the current-mirror circuit.

DETAILED DESCRIPTION OF THE PREFERRED EMBODIMENTS

Figure 1:
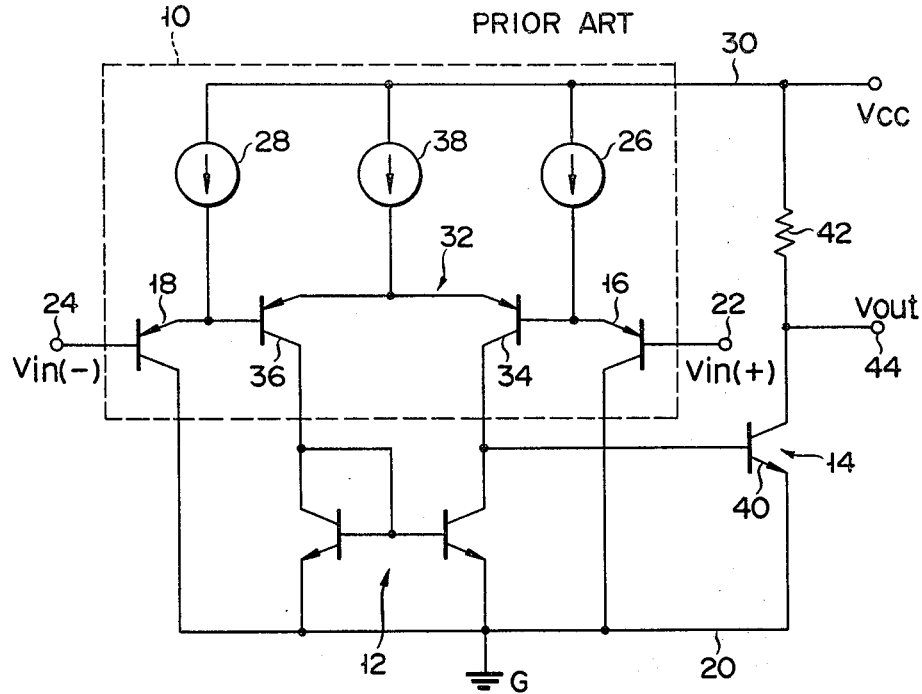
FIG. 1 is a circuit diagram showing a prior art voltage comparator.
Figure 2:
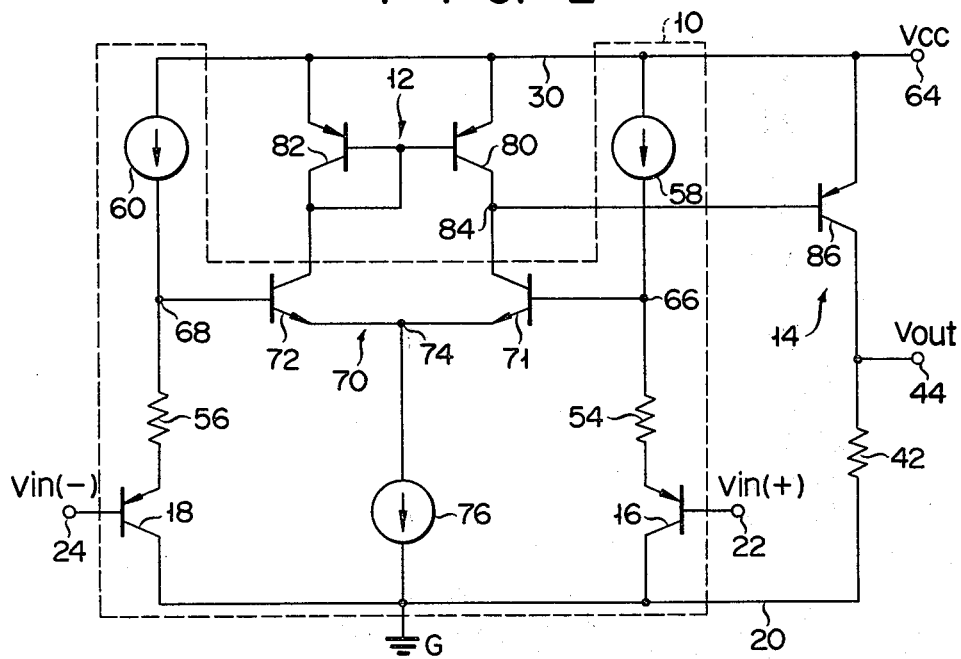
FIG. 2 is a circuit diagram showing a first embodiment of the voltage comparator according to the present invention.

FIG. 2 shows a first embodiment of the voltage comparator according to the present invention, which comprises an input circuit section 10, a current-mirror circuit section 12 and an output section 14. The input circuit 10 includes noninverting and inverting input transistors 16 and 18 respectively of PNP conductivity type. These input transistors 16 and 18 have their bases respectively connected to noninverting and inverting input terminals 22 and 24 and their collectors commonly connected to a ground potential line 20 which is connected to ground G. The emitters of the transistors 16 and 18 are connected to the power potential line 30 respectively through resistors 54 and 56 for permitting the level shift of the transistors 16 and 18 and respectively through constant-current sources 58 and 60. The power potential line 30 is connected to a power voltage terminal 64, to which the power voltage $V_{cc}$ is applied. The junctures 66 and 68 between the respective resistors 54 and 56 on one hand and respectively the constant-current sources 58 and 60 on the other hand are respectively connected to the bases of transistors 71 and 72 which form a differential pair 70. The differential pair transistors 71 and 72 have the opposite NPN conductivity type from the input transistors 16 and 18. The emitters of the differential pair transistors 71 and 72 are connected to each other at a common emitter juncture 74 which is connected through a constant-current source 76 to ground potential line 20. The collectors of the differential pair transistors 71 and 72 are connected through a current-mirror circuit 12, which has a well-known construction and serves as an active load, to the power potential line 30. More particularly, the collectors of the differential pair transistors 71 and 72 are respectively connected to the collectors of differential pair transistors 80 and 82 in the current-mirror circuit 12. The transistors 80 and 82 have their bases connected to each other and their emitters connected to the power potential line 30. The base and collector of one of these transistors, namely transistor 82, are connected to each other. The juncture 84 between the collector of the other transistor 80 and the collector of the corresponding differential pair transistor 71 is connected to the base of an output transistor 86 which is provided in an output circuit section 14. The output transistor 86 has a PNP conductivity type. The output transistor 86 has its emitter directly connected to the power potential line 30 and its collector connected through a load resistor 42 to ground potential line 20 and directly to an output terminal 44.

Figure 3:
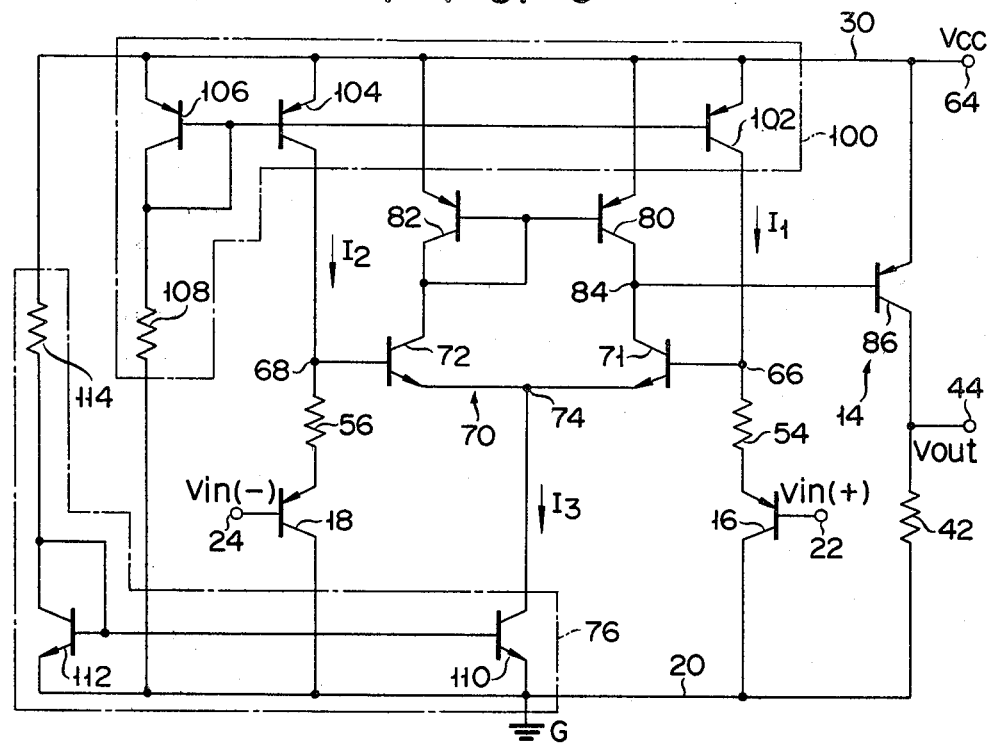
FIG. 3 is a circuit diagram showing a further detailed construction of the circuit of FIG. 2.

FIG. 3 shows a further detailed construction of the circuit of the first embodiment of FIG. 2, and the identical reference numbers are employed to designate parts and elements corresponding to those used in FIG. 2 and further explanation is omitted. A block designated by reference numeral 100 in FIG. 3 constituting the constant-current sources 58 and 60 shown in FIG. 2, for instance is formed by three PNP transistors, 102, 104 and 106 and a resistor 108. The transistors 102 and 104 have their emitters connected to the power potential line 30 and their collectors connected to the respective junctures 66 and 68 mentioned above. The remaining transistor 106 has its emitter connected to the power potential line 30 and its collector connected through a resistor 108 to ground potential line 20. The bases of the transistors 102, 104 and 106 are commonly connected, and the base and collector of the transistor 106 are connected to each other.

The other constant-current source 76 is formed by, for instance, two NPN transistors 110 and 112 and a resistor 114. The transistor 110 has its emitter grounded and its collector connected to the common emitter juncture 74 of the differential pair 70. The other transistor 112 has its emitter connected to the ground potential line 20 and its collector connected through the resistor 114 to the power potential line 30. The base and collector of the transistor 112 are connected to each other.

As for the circuit constants of this circuit, the resistance of the resistor 108 is set preferably to $R_{(108)} = 3.3$ kΩ and the resistance of the resistor 114 preferably to $R_{(114)} = 33$ kΩ. The collector currents $I_1$ and $I_2$ in the transistors 102 and 104 corresponding respectively to the output currents from the constant-current sources 58 and 60 (i.e., currents through the resistors 54 and 56 respectively) when $V_{cc} = 1$ V are preferably both substantially to 100 μA. The output current from the constant-current source 76 is preferably substantially equal to 10 μA. In addition, the resistances of the resistors 54 and 56 are both set to 1 kΩ, and the resistance of the resistor 42 is set to 10 kΩ.

With the above construction of the first embodiment, the potential $V_{(66)}$ at the juncture 66 is given as $$V_{(66)} = V_{in(+)} = V_{BE(16)} + I_1 \cdot R_{(54)} \qquad (7)$$

where $V_{in(+)}$: the voltage ($\geqq 0$) of the input signal supplied to the noninverting input terminal 22;

$V_{BE(16)}$: the base-emitter voltage across the transistor 16;

$I_1$: the current provided by the constant-current source 58 and flowing through the resistor 54; and $R_{(54)}$: the resistance of the resistor 54.

Likewise, the potential $V_{(68)}$ at the juncture 68 is $$V_{(68)} = V_{in(-)} + V_{BE(18)} + I_2 \cdot R_{(56)} \qquad (8)$$

where $V_{in(-)}$: the voltage ($\geqq 0$) of the input signal supplied to the inverting input terminal 24;

$V_{BE(18)}$: the base-emitter voltage across the transistor 18;

$I_2$: the current provided by the constant-current source 60 and flowing through the resistor 56; and $R_{(56)}$: the resistance of the resistor 56. Here, by setting $V_{BE(16)} = V_{BE(18)} = V_{BE}$,
$I_1 = I_2 = I$ and
$R_{(54)} = R_{(56)} = R$ and subtracting the equation 8 from the equation 7, the following relationship is realized:

$$V_{(66)} - V_{(68)} = V_{in(+)} - V_{in(-)} \qquad (9)$$

It will be seen from the equation 9 that the potential difference between the pair of input signal voltages $V_{in(+)}$ and $V_{in(-)}$ is equal to the potential difference between the bases of the differential pair transistors 71 and 72. The differential pair 70 is driven by this potential difference.

Meanwhile, by setting the transconductance $g_m$ of the differential pair 70 as $$g_m = (I_3 / 2V_T) \qquad (10)$$

where $V_T$: a constant and $I_3$: the current provided by the constant-current source 76, the output voltage $V_{out}$ at the output terminal 44 is $$V_{out} = g_m \{V_{in(+)} - V_{in(-)}\} \beta_{(86)} \cdot R_{(42)} \qquad (11)$$

where $\beta_{(86)}$: the common emitter current amplification factor of the output transistor 86; and $R_{(42)}$: the resistance of the load resistor 42. Also, the voltage amplification factor $A_v$ is $$A_v = g_m \beta_{(86)} \cdot R_{(42)} \qquad (12)$$

If $V_T$ is set to 25 mV, $I_3$ to 21 μA, $\beta_{(86)}$ to 40 and $R_{(42)}$ to 10 kΩ, the voltage amplification factor $A_v$ is from the equations 10 and 12, $$A_v = 168 \; (45 \text{ dB}) \qquad (13)$$

Now, when the voltage $V_{in(+)}$ of the input signal supplied to the noninverting input terminal 22 becomes higher than the voltage $V_{in(-)}$ of the other input signal supplied to the inverting input terminal 24, the voltage at the juncture 66 is increased in relation to the voltage at the juncture 68. Thus, the base voltage on the transistor 71 of the differential pair 70 is increased according to the voltage level difference $V_{in(+)} - V_{in(-)}$, whereby the current flowing through the collector-emitter path of the transistor 71 into the emitter common juncture 74 is increased. At this time, the current flowing from the emitter common juncture 74 to ground G is forcibly held constant by the constant-current source 76. As a result, the current flowing through the collector-emitter path of the other transistor 72 in the differential pair 70 into the emitter common juncture 74 is reduced according to the increment of increase of the current through the transistor 71. Thus, the transistor 71 of the differential pair 70 is turned "on", while the other transistor 72 is turned "off". At this time, the current flowing through the collector-emitter path of the transistor 80 in the current-mirror circuit 12 is reduced, thus increasing the base current to the output transistor 86 to turn "on" this transistor 86. Consequently, the output voltage $V_{out}$ appearing at the output terminal 44 becomes substantially equal to the power voltage $V_{cc}$, that is, the output terminal 44 is in the logic "HIGH" level. On the other hand, when the input signal voltage $V_{in(-)}$ to the inverting input terminal 24 becomes higher than the input signal voltage $V_{in(+)}$ to the noninverting input terminal 22, the base voltage on the transistor 72 of the differential pair 70 or the voltage at the juncture 68 is increased. Thus, the current through the collector-emitter path of the transistor 72 is increased to turn "on" the transistor 72, while the current through the collector-emitter path of the transistor 71 is reduced to turn "off" the transistor 71 of the differential pair 70. As a result, the current through the collector-emitter path of the transistor 80 in the current mirror-circuit 12 is increased to reduce the base current to the output transistor 86, thus eventually turning "off" the output transistor 86. Consequently, the output voltage $V_{out}$ at the output terminal 44 becomes substantially equal to the ground potential or 0 V, that is, the output terminal 44 is in the logic "LOW" level state. It will be readily understood that the first embodiment of the invention shown in FIGS. 2 and 3 has the function of a voltage comparator.

The input signal voltages ($V_{in(+)}$ and $V_{in(-)}$) to the respective noninverting and inverting input terminals 22 and 24 are related to the power voltage $V_{cc}$ as $$V_{in(+)} + V_{BE(16)} + I_1 \cdot R_{(54)} - V_{EB(71)} + V_{CE(71)} + V_{BE(86)} = V_{cc} \qquad (14)$$

and $$V_{in(-)} + V_{BE(18)} + I_2 \cdot R_{(56)} - V_{BE(72)} + V_{CE(72)} + V_{BE(82)} = V_{cc} \qquad (15)$$

where $B_{BE(71)}$: the base-emitter voltage across the transistor 71;

$V_{CE(71)}$: the collector-emitter voltage across the transistor 71;

$V_{BE(72)}$: the base-emitter voltage across the transistor 72;

$V_{CE(72)}$: the collector-emitter voltage across the transistor 72;

$V_{BE(86)}$: the base-emitter voltage across the transistor 86; and $V_{BE(82)}$: the base-emitter voltage across the transistor 82.

By setting $$V_{BE(16)} = V_{BE(71)} = V_{BE(86)} = V_{BE(18)} = V_{BE(72)} = -V_{BE(82)} = V_{BE},$$
$$I_1 = I_2 = I,$$
$$R_{(54)} = R_{(56)} = R, \text{ and}$$
$$V_{CE(71)} = V_{CE(72)} = V_{CE}$$

and substituting the equations 3 and 4 into the equations 14 or 15, we obtain $$V_{cc} > V_{BE} + I \cdot R + V_{CE} \qquad (16)$$

In the equation 16, the value of $V_{BE}$ actually equals to 0.7 V as described above, and the value of $V_{CE}$ is set at least more than 0.1 V within the current region (for example, several μA through several hundreds of μA), which is necessary in the case of providing the first embodiment circuit in integrated form. Further, the value of $I \cdot R$ is set in the following way.

In the noninverting input side closed loop circuit constituted by the transistor 16, resistor 54, transistor 71 and constant-current source 76, the following a voltage equation applies $$V_{in(+)} + V_{BE(16)} + I \cdot R - V_{BE(71)} - V_{S(76)} = 0 \qquad (17)$$

where $V_{S(76)}$ = the voltage drop across constant-current source 76. On the other hand, for the inverting input side closed loop circuit constituted by the transistor 18, resistor 56, transistor 72 and constant-current source 76, the voltage equation is $$V_{in(-)} + V_{BE(18)} + I \cdot R - V_{BE(72)} - V_{S(76)} = 0 \qquad (18)$$

By substituting $V_{BE(16)} = V_{BE(71)} = V_{BE(18)} = -V_{BE(72)} = V_{BE}$ into the equations 17 and 18 and transforming, $$V_{in(+)} = I \cdot R = V_{S(76)} \qquad (19)$$

and $$V_{in(-)} + I \cdot R = V_{S(76)} \qquad (20)$$

Since $V_{S(76)}$ in the equations 19 and 20 is known to be 0.1 V as in the prior art, it will be seen that $I \cdot R$, i.e., the voltage drop across the resistor 54 or 56, may be 0.1 V.

Thus, by substituting $I \cdot R = 0.1$ volt and also $V_{BE} = 0.7$ volt and $V_{CE} = 0.1$ volt as the respective actual values into the equation 16, $$V_{cc} \geq 0.9 \qquad (21)$$

In other words, the voltage comparator of the first embodiment of the invention can operate satisfactorily so long as the power voltage $V_{cc}$ is set to a value equal to or at least higher than 0.9 V. Thus, the ineffective voltage drop can be reduced to extend the allowable range of the power voltage $V_{cc}$ and also reduce power consumption. In addition, where the the power voltage $V_{cc}$ in the above circuit of the first embodiment is set to 2 V as in the prior art, the allowable amplitude range for the input voltage signals supplied to the noninverting and inverting input terminals 22 and 24 can be extended to a wide range from 0 to 1.1 V out of consideration of the equation 21. Further, the ratio of the input signal amplitude range to the power voltage $V_{cc}$ can be enlarged to increase the efficiency of the voltage comparator.

Figure 4:
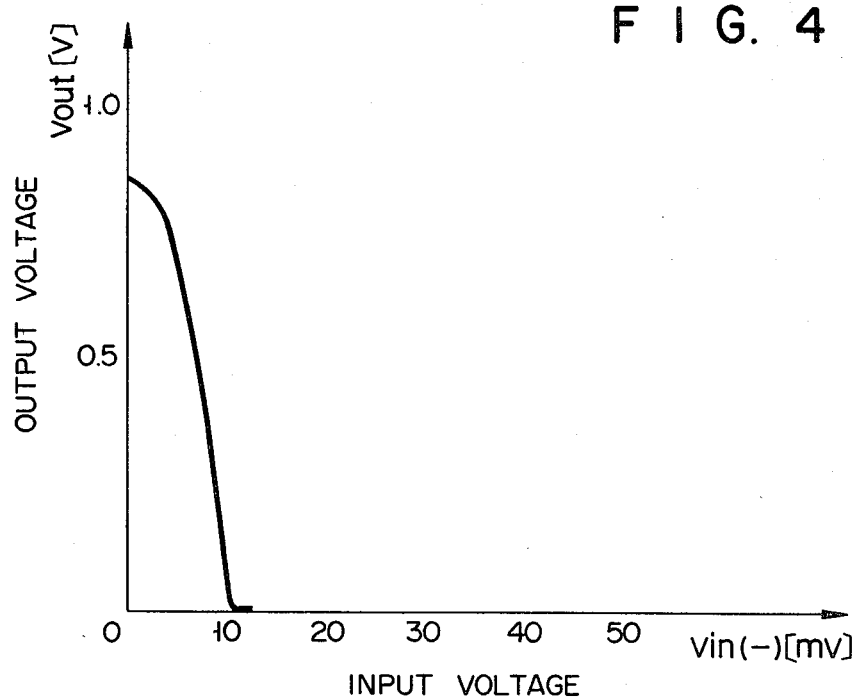
FIGS. 4 to 7 are graphs showing voltage transfer characteristics of the first embodiment of the voltage comparator under different conditions.
Figure 5:
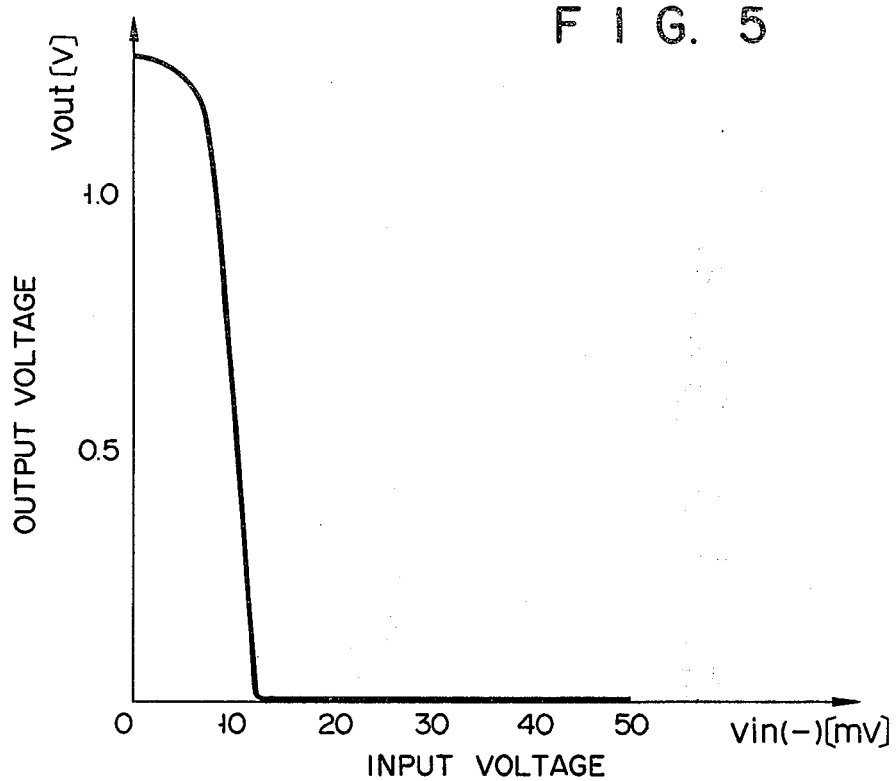
Figure 6:
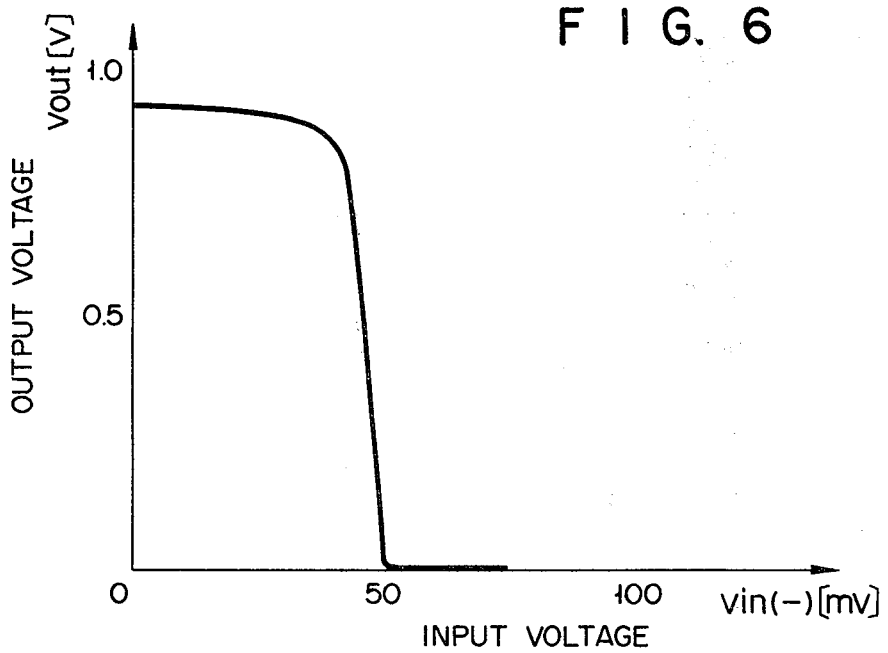
Figure 7:
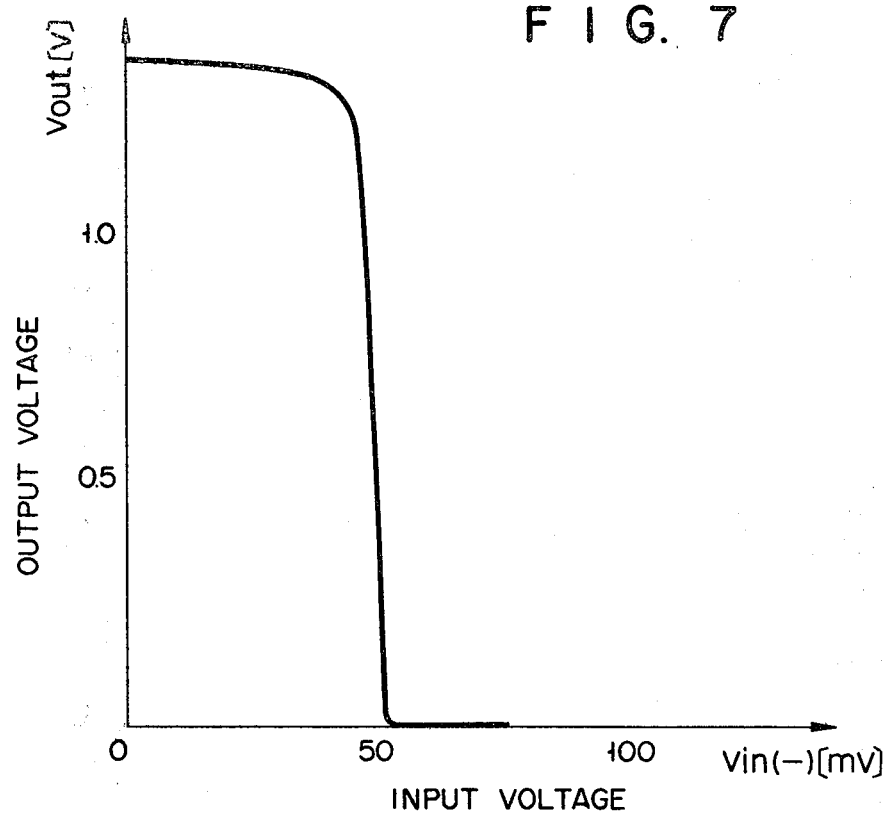

FIGS. 4 to 7 show voltage transfer characteristics of the output voltage (in volts) appearing at the output terminal 44 in the circuit of the first embodiment of FIGS. 2 and 3 when the voltage $V_{in(-)}$ (in milivolts) at the inverting input terminal 24 is varied while holding the input voltage $V_{in(+)}$ at the noninverting input terminal 22 at a constant voltage level. The characteristics of FIG. 4 is obtained with $V_{cc} = 1$ V and $V_{in(+)} = 10$ mV; the characteristic of FIG. 5 is obtained with $V_{cc} = 1.4$ V and $V_{in(+)} = 10$ mV; the characteristic of FIG. 6 is obtained with $V_{cc} = 1$ V and $V_{in(+)} = 50$ mV; and the characteristic of FIG. 7 is obtained with $V_{cc} = 1.4$ V and $V_{in(+)} = 50$ mV. It will be seen from these voltage transfer characteristics that the first embodiment circuit can also be made to function as an inverting amplifier by making the noninverting input voltage $V_{in(+)}$ constant. The voltage amplification factor $A_v$ when the circuit acts as the inverting amplifier is obtained from FIGS. 4 to 7 by the well-known method and is $$A_v = 110 \text{ (41 dB)} \qquad (22)$$

when $V_{cc}$ is 1 V and $$A_v = 220 \text{ (47 dB)} \qquad (23)$$

when $V_{cc}$ is 1.4 V. These values obtained from the voltages characteristics mentioned above substantially coincide with the value obtained using the equation 12 and shown in equation 13. In this connection, the fact that the voltage amplification factor $A_v$ is increased when $V_{cc} = 1.4$ V (i.e., when the power voltage is comparatively high), is attributable to the increase of the transconductance $g_m$ in the equation 12 accompanying the current from the constant-current source 76.

In the circuit of the first embodiment shown in FIGS. 2 and 3, the base-emitter voltages $V_{BE(n)}$ of the transistors 16, 18, 71, 72, 80, 82, 86, 102, 106, 110 and 112 (with n being the reference numeral of each transistor) and the voltage drops $V_{S(n)}$ of the constant-current sources 58, 60 and 76 (with n being the reference numeral of each constant-current source) actually do not coincide, and thus the input off-set voltage cannot be completely set to 0 V. More particularly, denoting the difference between the base-emitter voltages $V_{BE(16)}$ and $V_{BE(18)}$ of the input transistors 16 and 18 by $\Delta V_{BE1}$ and the difference between the base-emitter voltages $V_{BE(71)}$ and $V_{BE(72)}$ of the differential pair transistors 71 and 72 by $\Delta V_{BE2}$, the input off-set voltage $V_{OS}$ is given as $$V_{OS} = \Delta V_{BE1} + \Delta V_{BE2} - I_1 \cdot R_{(54)} + I_2 \cdot R_{(56)}$$
$$(24)$$

Also, $$I_1 = I_2(1 + \Delta I), \Delta I << 1 \qquad (25)$$

and $$R_{(54)} = R_{(56)}(1 + \Delta R), \Delta R << 1 \qquad (26)$$

where
  $\Delta I$: the index of error between the currents $I_1$ and $I_2$; and
  $\Delta R$: the index of error between the resistances $R_{(54)}$ and $R_{(56)}$. By setting $$\Delta V_{BE1} = \Delta V_{BE2} = \Delta V_{BE}$$

and substituting the equations 25 and 26 into the equations 24, we obtain $$V_{OS} = 2\Delta V_{BE} - I_2 \cdot R_{(56)}(\Delta I + \Delta R) \quad (27)$$

In the equation 27, $\Delta V_{BE}$ takes a value of $\pm 2$ mV in the case of a semiconductor integrated circuit, while $\Delta I$ and $\Delta R$ can be set with errors within $\pm 1\%$ and $I_2 \cdot R_{(56)}$ is 0.1 V as mentioned earlier. With these values, the second term of the right side of the equation 27 is totally about $\pm 2$ mV, and the input off-set voltage $V_{OS}$ is $\pm 6$ mV. The off-set voltage $V_{OS}$, actually obtained directly from the voltage transfer characteristics of FIGS. 4 to 7, was 3.5 mV maximum.

Table I below shows the results of measurements of the switching characteristics of the first embodiment of the invention as an inverting amplifier.

TABLE I

| $V_{cc}$ | tpd$_1$ | tpd$_2$ | tr | tf |
|---|---|---|---|---|
| 1 V | 2.4 μsec. | 0.8 μsec. | 0.8 μsec. | 1.4 μsec. |
| 1.4 V | 1.0 μsec. | 0.8 μsec. | 0.4 μsec. | 1.0 μsec. |

Figure 8A:
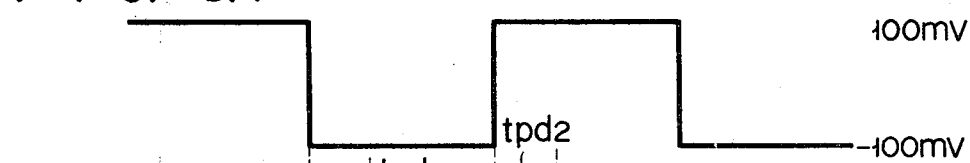
FIGS. 8A and 8B are views showing the waveforms of the input signal to and output signal from the voltage comparator of FIG. 2.
Figure 8B:
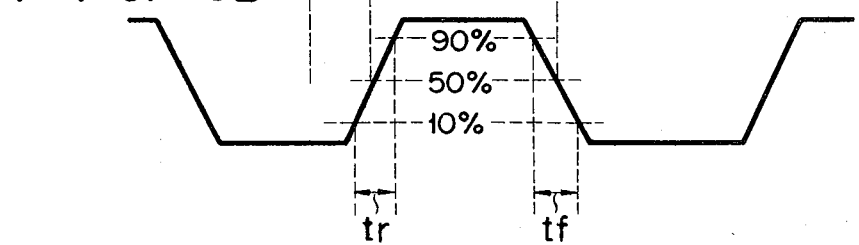

In Table I above, "tpd$_1$" and "tpd$_2$" represent different signal propagation delay times, "tr" represents the pulse rising period, and "tf" the pulse falling period. All these time values are obtained as measurements with the input signal as shown in FIG. 8A supplied to the input terminal of the circuit of the first embodiment shown in FIGS. 2 and 3, particularly the circuit of FIG. 3, which is used as the inverting amplifier as mentioned. The input signal shown in FIG. 8A is a rectangular signal with an amplitude of $\pm 100$ mV, and all the time periods tpd$_1$, tpd$_2$, tr and tf mentioned above are values in the output signal shown in FIG. 8B which is provided in response to the input signal of FIG. 8A. In this case, the maximum switching frequency was $f_{sw.max} \approx 200$ kHz when $V_{cc} = 1$ V, and $f_{sw.max} \approx 500$ kHz when $V_{cc} = 1.4$ V.

It will be appreciated from the above that in addition to the aforementioned advantage, the first embodiment of the present invention can also be used as an inverting amplifier and permit wide reduction of the input off-set voltage $V_{OS}$, that is, it can extend the scope of utility of the voltage comparator and increase the reliability of operation thereof.

Figure 9:
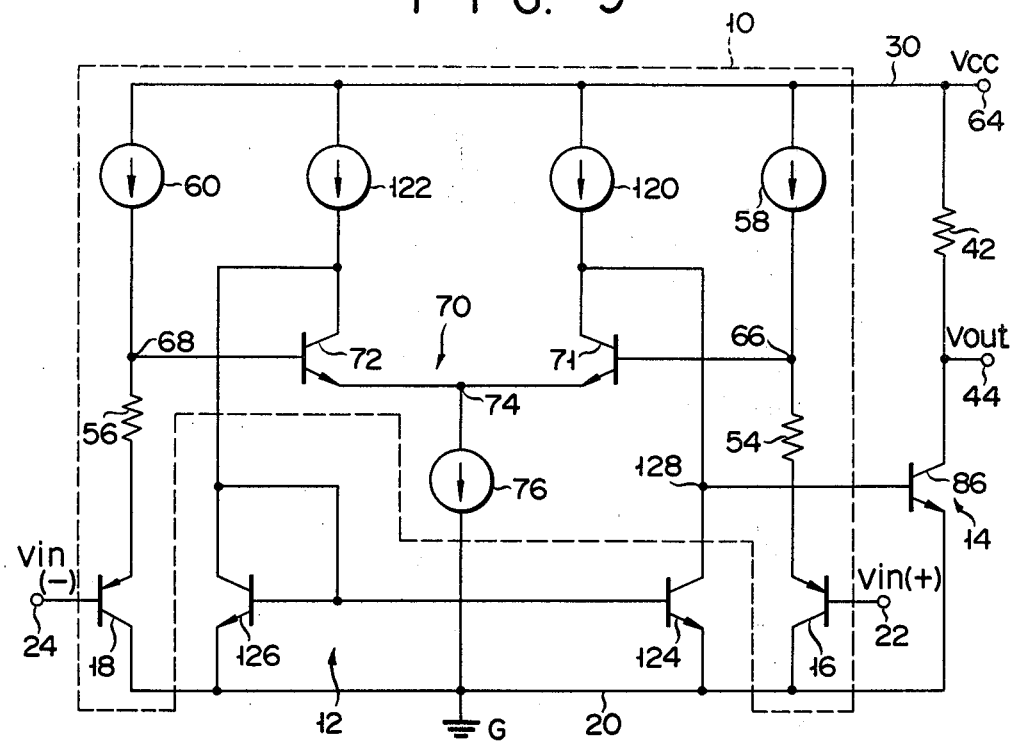
FIG. 9 is a circuit diagram showing a second embodiment of the voltage comparator according to the present invention.

FIG. 9 shows a second embodiment of the voltage comparator according to the present invention. In the Figure, the identical reference numbers are employed to designate parts and elements corresponding to those used in the first embodiment circuit of FIGS. 2 and 3 and further explanation is omitted. In this second embodiment, the collectors of the pair NPN conductivity type transistors 71 and 72 forming the differential pair 70 in the input circuit section 10 are respectively connected through pair constant-current sources 120 and 122 to the power potential line 30. Thus, these collectors receive bias currents from the constant-current sources 120 and 122 respectively. Further, the collectors of transistors 71 and 72 are respectively connected to the collectors of NPN conductivity type transistors 124 and 126, which constitute the current-mirror circuit 12. The transistors 124 and 126 of the current-mirror circuit 12, which are of the NPN conductivity type, have their emitters connected to the ground potential line 20 and the bases thereof connected to each other. The base and collector of the transistor 126 are connected to each other. The juncture 128 between the collector of the noninverting input side differential pair transistor 71 and the collector of the other transistor 124 of the current-mirror circuit 12 is directly connected to the base of the NPN conductivity type output transistor 86 which forms the output circuit section 14. The collector of the transistor 86 is connected through the load resistor 42 to the power potential line 30 and also connected directly to the output terminal 44.

Figure 10:
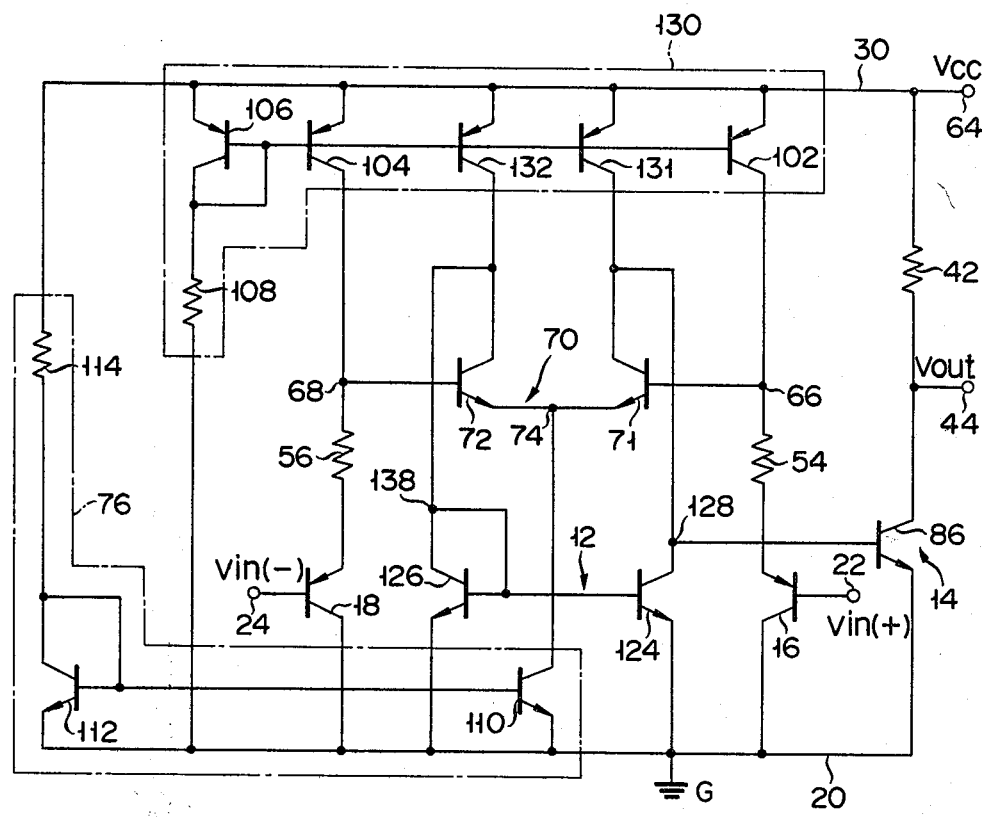
FIG. 10 is a circuit diagram showing a further detailed construction of the circuit of FIG. 9.

FIG. 10 shows a further detailed construction of the circuit of FIG. 9. In this figure, the identical reference numbers are employed to designate parts and elements corresponding to those used in FIG. 9 and further explanation is omitted.

The block designated at 130 in FIG. 10 includes the constant-current sources 58, 60, 120 and 122 shown in FIG. 9. More particularly, the constant-current source 130 includes, in addition to the three transistors 102, 104 and 106 shown in FIG. 3, two other PNP conductivity type transistors 131 and 132. These transistors 131 and 132 have their emitters directly connected to the power potential line 30 and the collectors thereof connected to the respective pair transistors 71 and 72 of the differential pair 70. Like the case of FIG. 3, the bases of all the transistors 102, 104, 106, 131 and 132 in the constant-current source 130 are commonly connected. The base and collector of the transistor 106 are commonly connected to each other. The other constant-current source 76 has the same construction as in the circuit of FIG. 3. The resistor 108 in the constant-current source 130 is set to, for instance, 3.3 kΩ, whereby the output current of the constant-current sources 58, 60, 120 and 122 (FIG. 9) is set to 100 μA. The resistor 114 in the other constant-current source 76 is set to, for instance, 33 or 3.3 kΩ, whereby the output current of the constant-current source 76 (FIG. 9) is set to 10 or 100 μA.

Figure 11:
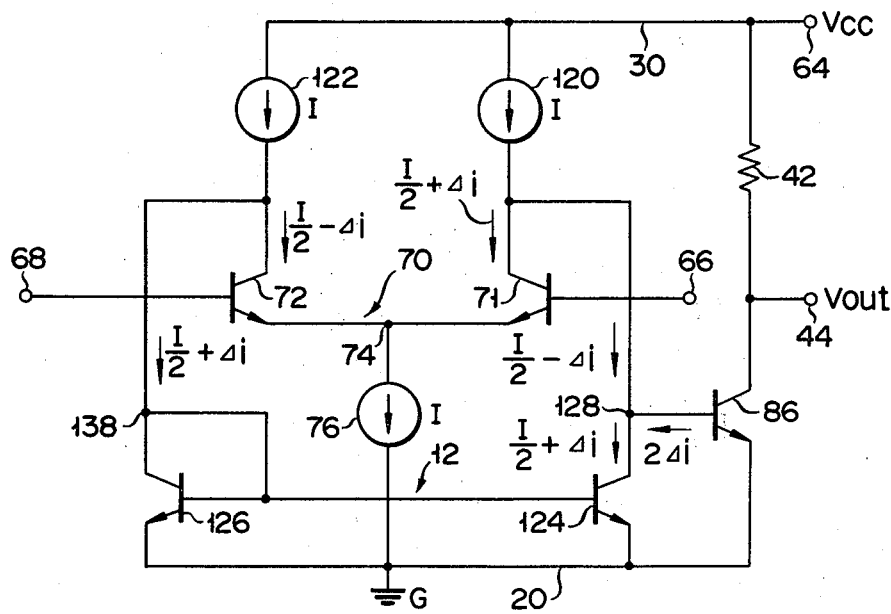
FIG. 11 is a circuit diagram showing the current distribution in the main portion of the circuit of the second embodiment of the present invention.

Now, the current from the constant-current sources 76, 120 and 122 is denoted by "I", the base voltage on the noninverting input side transistor 71 of the differential pair 70 by $V_{in(+)} + \Delta v$, and the base voltage on the inverting input side transistor 72 by $V_{in(-)} - \Delta v$. Then, as shown in FIG. 11, since the current through the collector-emitter path of the transistor 71 is $I/2 + \Delta i$ while the normal current I is caused from the emitter common juncture 74 to ground G by the constant-current source 76, a current $I/2 - \Delta i$ flows through the collector-emitter path of the transistor 72. Further, a current of $I/2 + \Delta i$ is caused to flow from the constant-current source 122 to the common juncture 138 between the collector of differential transistor 72 and the collector of transistor 126 of current-mirror circuit 12. On the other hand, a current of $I/2 + \Delta i$ is caused to the collector of the other transistor 124 in the current-mirror circuit 12 by the action thereof. At this time, the algebraic sum of the currents flowing into the juncture 128 is, from the Kirchhoff's first law, zero (provided that the in-coming current is represented by the positive sign and the out-going current by the negative sign), a current $+2\Delta i$, i.e., current of $2\Delta i$ from the base of the output transistor 86, flows into the juncture 128. Thus, provided $\Delta v$ is a negligible signal, $\Delta i$ and $\Delta v$ meet a relation $$\Delta i = (I/2V_T) \cdot \Delta v \quad (28)$$

where $V_T$ is a constant as shown by the equation 10 and selected to meet a condition $$|\Delta v / V_T| << 1 \quad (29)$$

Thus, when $\Delta v>0$, the output transistor 86 is in the "off" state, and the output terminal 44 is in the logic "HIGH" state. On the other hand, when $\Delta v<0$, the converse analysis to that discussed above applies, that is, the base current to the output transistor 86 is $-2\Delta i$, which is opposite in direction to that shown in FIG. 11. In other words, a current $2\Delta i$ flows from the juncture 128 to the base of the transistor 86. Thus, the output transistor 86 is turned to the "on" state, and the output terminal 44 is in the logic "LOW" state. It will thus be understood that the circuit of the second embodiment has a function of the voltage comparator. Also, since the equations 16 and 21 mentioned above hold even in this circuit, sufficient operation as the voltage comparator can be obtained with the second embodiment so long as the power voltage $V_{cc}$ is set equal to or at least higher than 0.9 V. Thus, the effective voltage drop can be reduced, and also the allowable amplitude range of the input signal can be extended to increase the efficiency of the circuit.

Table II below shows the results of measurements carried out with the second embodiment adapted as an inverting amplifier in the manner as described previously. In the Table II, "Case A" shows the case of respectively setting the current value of constant-current source 76 and the resistance value of load resistor 42 to 10 μA and 10 kΩ, and "Case B" indicates the case of respectively setting the current value of constant-current source 76 and the resistance value of load resistor 42 to 100 μA and 1 kΩ.

TABLE II

|  | $V_{cc}$ | tpd₁ | tpd₂ | tr | tf |
|---|---|---|---|---|---|
| Case A | 1 V | 0.6 μsec. | 0.1 μsec. | 1.3 μsec. | 0.1 μsec. |
|  | 1.4 V | 0.3 μsec. | 0.2 μsec. | 0.5 μsec. | 0.1 μsec. |
| Case B | 0.8 V | 120 nsec. | 200 nsec. | 400 nsec. | 200 nsec. |
|  | 1 V | 150 nsec. | 110 nsec. | 80 nsec. | 20 nsec. |
|  | 1.4 V | 90 nsec. | 80 nsec. | 30 nsec. | 20 nsec. |

To study the switching operation of the circuit as the inverting amplifier, $$\Sigma_t = tpd_1 + tpd_2 + tr + tf \tag{30}$$

will now be considered. When $V_{cc}=1.4$ V in Case A, $\Sigma_t$ is $\Sigma_t=1.1$ μsec. and is extremely reduced compared to $\Sigma_t=3.2$ μsec. in the case of $V_{cc}=1.4$ V in Table I given above.

In the second embodiment of FIGS. 9 and 10, PNP conductivity type transistors which have a lateral structure are not used but NPN conductivity type transistors are used for the transistors 124 and 126 of the current-mirror circuit 12 and the output transistor 86 in a semiconductor integrated circuit. This is done because the lateral structure transistor has undesired effects of reducing the switching frequency of the circuit and reducing the response speed. Thus, with the second embodiment of the present invention it is possible to reliably prevent the reduction of the switching frequency of the inverting amplifier and also to provide for about three times the response speed of the circuit containing PNP transistors. Further, it has been confirmed that where the output current of the constant-current source 76 is set to 100 μA and the resistance of the load resistor 58 to 1 kΩ, switching operation at substantially 5 MHz is possible as is seen from Case B in Table II above.

Although the present invention has been shown and described with respect to particular embodiments, nevertheless, various changes and modifications with are obvious to a person skilled in the art to which the invention pertains are deemed to lie within the spirit, scope and contemplation of the invention.

What is claimed is:

1. A voltage comparator comprising:
   (a) input circuit means connected to a first potential line for receiving first and second electrical signals and providing an output current varying according to the voltage level difference between the first and second electrical signals, said input circuit means including:
      (i) first and second transistors of one conductivity type each having an emitter, a base, and a collector electrode, the first and second electrical signals being respectively supplied to said base electrodes of said first and second transistors, and said collector electrodes being connected to said first potential line;
      (ii) a differential pair formed by third and fourth transistors of the opposite conductivity type from that of said first and second transistors, said third and fourth transistors each having an emitter, a base, and a collector electrode, said emitter electrodes being connected to each other; and
      (iii) first and second resistors connected respectively between said first transistor emitter electrode and said third transistor base electrode and between said second transistor emitter electrode and said fourth transistor base electrode; and
   (b) a current-mirror circuit connected between a second potential line and said collector electrodes of said third and fourth transistors of said input circuit means; and
   (c) output circuit means connected to said current-mirror circuit, for switching operation in response to the output current from said input circuit means to provide a third electrical signal corresponding to the voltage level difference between said first and second electrical signals, said output circuit means including a fifth transistor having an emitter, a base, and a collector electrode, said base electrode being connected directly to said collector electrode of either said third or said fourth transistor and the emitter-collector path of said fifth transistor being connected between said first and second potential lines.

2. A voltage comparator according to claim 1, further comprising a first constant-current source connected between said first potential line and said emitter electrodes of said third and fourth transistors.

3. A voltage comparator according to claim 2, further comprising:
   (a) a second constant-current source connected between said potential line and said base electrode of said third transistor; and
   (b) a third constant-current source connected between said second potential line and said base electrode of said fourth transistor.

4. A voltage comparator according to claim 1, wherein said fifth transistor is of the same conductivity type as said first and second transistors, and said collector electrode and said emitter electrode of said fifth transistor are connected respectively to said first potential line and said second potential line.

5. A voltage comparator according to claim 4, further comprising an output terminal for generating said third electrical signal, said output terminal being connected to said collector electrode of said fifth transistor of said output circuit means.

6. A voltage comparator according to claim 1, wherein said fifth transistor is of the opposite conductivity type from that of said first and second transistors, and said collector electrode and said emitter electrode of said fifth transistor are connected respectively to said second potential line and said first potential line.

7. A voltage comparator according to claim 6, further comprising an output terminal for generating said third electrical signal, said output terminal being connected to said collector electrode of said fifth transistor of said output circuit means.

8. A voltage comparator according to claim 7, wherein said first potential line is held at the ground potential and a positive potential power voltage is applied to said second potential line.

9. A voltage comparator according to claim 5, wherein said first potential line is held at the ground potential and a positive potential power voltage is supplied to said second potential line.

10. A voltage comparator comprising:
first and second transistors of a first conductivity type and having base electrodes respectively connected to first and second input terminals and collector electrodes connected to a first potential line;
third and fourth transistors of a second conductivity type and having base electrodes respectively connected through first and second resistors to emitter electrodes of said first and second transistors and also connected through first and second constant-current sources to a second potential line and emitter electrodes commonly connected to each other and also connected through a third constant-current source to said first potential line;
fifth and sixth transistors of said first conductivity type having base electrodes commonly connected, emitter electrodes connected to said second potential line and collector electrodes respectively connected to the collectors of said third and fourth transistors, the base and collector electrodes of said sixth transistor being connected to each other; and
a seventh transistor of said first conductivity type having a base electrode connected to the juncture between the collector of said third transistor and the collector of said fifth transistor, an emitter electrode connected to said second potential line and collector electrode connected through a third resistor to said first potential line and also connected to an output terminal.

11. A voltage comparator according to claim 10, wherein said first potential line is grounded and a positive potential power voltage is supplied to said second potential line.

12. A voltage comparator according to claim 10, wherein said first conductivity type is the PNP conductivity type and said second conductivity type is the NPN conductivity type.

13. A voltage comparator according to claim 10, wherein said first input terminal is used as a noninverting input terminal and said second input terminal is used as an inverting input terminal.

14. A voltage comparator comprising:
first and second transistors of a first conductivity type having base electrodes respectively connected to first and second input terminals and collector electrodes connected to a first potential line;
third and fourth transistors of a second conductivity type having base electrodes respectively connected through first and second resistors to emitter electrodes of said first and second transistors and also connected through first and second constant-current sources to a second potential line, emitter electrodes commonly connected to each other and also connected through a third constant-current source to said first potential line and collector electrodes respectively connected through fourth and fifth constant-current sources to said second potential line;
fifth and sixth transistors of said second conductivity type having base electrodes commonly connected to each other, emitter electrodes connected to said first potential line and collector electrodes connected to the collector electrodes of said third and fourth transistors, the base and collector electrodes of said sixth transistor being connected to each other; and
a seventh transistor of said second conductivity type having base electrode connected to the juncture between the collector electrode of said third transistor and the collector electrode of said fifth transistor, emitter electrode connected to said first potential line and collector electrode connected through a third resistor to said second potential line and also connected to an output terminal.

15. A voltage comparator according to claim 14, wherein said first potential line is grounded and a positive potential power voltage is supplied to said second potential line.

16. A voltage comparator according to claim 14, wherein said first conductivity type is the PNP conductivity type and said second conductivity type is the NPN conductivity type.

17. A voltage comparator according to claim 14, wherein said first input terminal is used as a noninverting input terminal and said second input terminal is used as an inverting input terminal.

* * * * *